(12) United States Patent
Lee et al.

(10) Patent No.: US 7,432,752 B1
(45) Date of Patent: Oct. 7, 2008

(54) DUTY CYCLE STABILIZER

(75) Inventors: Bumha Lee, Pleasanton, CA (US); Sing W. Chin, Alameda, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/739,594

(22) Filed: Apr. 24, 2007

(51) Int. Cl.
*H03K 3/017* (2006.01)

(52) U.S. Cl. ........................... 327/175; 327/172

(58) Field of Classification Search ............. None
See application file for complete search history.

(56) References Cited

U.S. PATENT DOCUMENTS

| | | | |
|---|---|---|---|
| 5,963,071 A * | 10/1999 | Dowlatabadi | 327/175 |
| 6,426,660 B1 * | 7/2002 | Ho et al. | 327/175 |
| 6,448,828 B2 | 9/2002 | Stark et al. | |
| 6,525,581 B1 | 2/2003 | Choi | |
| 6,943,604 B2 | 9/2005 | Minzoni | |
| 6,977,536 B2 * | 12/2005 | Chin-Chieh et al. | 327/116 |
| 2003/0201806 A1 | 10/2003 | Cho | |
| 2007/0013423 A1 | 1/2007 | Lee | |

* cited by examiner

*Primary Examiner*—Cassandra Cox
(74) *Attorney, Agent, or Firm*—Patent Law Group LLP; Carmen C. Cook

(57) ABSTRACT

A duty cycle stabilizer circuit (50) receiving an input clock signal and generating an output clock signal having a first duty cycle includes a leading edge pulse generator (52) and a pulse width extender circuit (54). The pulse generator generates a first clock pulse ($V_1$) having a leading edge triggered by the leading edge of the input clock signal and a first pulse width. The pulse width extender circuit generates a second clock pulse ($V_2$) having a leading edge triggered by the leading edge of the first clock pulse and a pulse width being stretched to the desired duty cycle. The duty cycle stabilizer further includes a buffer (64) providing the output clock signal having the first duty cycle, a charge pump (56) receiving the output clock signal directly and a differential amplifier (62) generating an output signal for controlling the pulse width of the first and second clock pulses.

26 Claims, 9 Drawing Sheets

DUTY CYCLE STABILIZER

FIELD OF THE INVENTION

The invention relates to duty cycle stabilizers and, in particular, to a duty cycle stabilizer that has low supply noise and wide operation range.

DESCRIPTION OF THE RELATED ART

As the clock frequency of analog circuits goes higher to process more information simultaneously, input clock duty cycle needs to be tightly controlled in order to achieve the best circuit performance. Measures for circuit performance include spurious free dynamic range (SFDR), signal-to-noise ratio (SNR), and operating speed. In some operation, a high operating speed is obtained by arranging the same amount of settling time on a pair of amplifiers, where one is working during the high clock phase and the other on the low clock phase. In most applications, 50% duty cycle of the input clock is strictly required when the analog circuit is implemented using switched capacitor circuits. In other applications, some specific duty cycle ratio may be required.

Recently, in communications applications, the demand for intermediate frequency (IF) sampling analog-to-digital converter (ADC) is growing rapidly for use in cost effective radio frequency (RF) transceiver systems. The ADC performance with a very high frequency input signal is frequently limited by not the thermal noise or the linearity of the circuit itself but strongly by the clock jitter. The signal-to-noise ratio (SNR) purely due to the clock jitter can be given as:

$$SNR|_{jitter} = 20 \cdot \log\left(\frac{1}{2\pi \cdot F_{in} \cdot t_j}\right), \quad \text{Eq. (1)}$$

where $F_{in}$ is the analog input frequency and $t_j$ is root mean square (rms) clock jitter. For instance, the performance of an ADC having 70 dB SNR at DC input can dropped down to 65.0 dB with clock jitter of 0.45 ps or 69.1 dB with clock jitter of 0.15 ps with a 200 MHz input signal, or 60.21 dB with 0.45 ps and 67.1 dB with 0.15 ps at a 400 MHz input signal. The impact of clock jitter is becoming even more prominent at higher input signal frequency.

It is not easy to achieve a 50% or other desired duty cycle from a low jitter clock generator, for example, a crystal oscillator. Conventional analog circuits employ a duty cycle stabilizer to achieve the desired duty cycle (such as 50%) from an input clock having an arbitrary duty cycle. The conventional duty cycle stabilizers are implemented using phase locked loop (PLL) or delay locked loop (DLL) circuits. PLLs and DLLs increase the clock jitter as these circuits introduce additional power supply and device noises. Hence, in high performance ADCs, the duty cycle stabilizer often has to be turned off during the IF sampling mode for better SNR, even though the duty cycle stabilizer is integrated within the integrated circuit of the ADC.

FIG. 1 illustrates a conventional duty cycle stabilizer which can be applied in high speed ADC devices to maintain the performance across wide range of duty cycle of the input clock. FIG. 2 includes signal waveforms of input clock, output clock and intermediate signals as well as the power supply and ground currents of the duty cycle stabilizer of FIG. 1. Referring to FIG. 1, a duty cycle stabilizer includes an edge detector 12, a phase-frequency detector (PFD) 14, a programmable delay cell 16, a charge pump (CP) 18 and a low pass filter (LPF) 20. The input clock signal (CLK_IN) is coupled to edge detector 12, which generates a narrow negative pulse ($V_1$). The falling edge of voltage $V_1$ flips PFD 14 which is formed by a set-reset (SR) flip flop. The output signal of PFD 14 transitions from low to high and is buffered for output as the output clock signal (CLK_OUT).

The signal processing block from CLK_OUT to the delay cell output node ($V_2$) keeps a close to 50% clock signal as shown in FIG. 2. More specifically, the output signal of PFD 14 (SR flip flop) goes from high to low status as triggered by the falling edge of voltage $V_2$. If the amount of currents $I_P$ and $I_N$ in charge pump 18 is the same and there is no charge injection mismatch caused by switches in the charge pump, then output clock CLK_OUT is to be guaranteed with 50% of duty cycle after the entire loop becomes stabilized. An arbitrary duty cycle of the output clock CLK_OUT can be generated by appropriately changing the current ratio between current $I_P$ and current $I_N$. Specifically, the duty cycle of the output clock CLK_OUT is given as:

$$Duty|_{CLKOUT} = \frac{I_N}{I_N + I_P}. \quad \text{Eq. (2)}$$

Since the rising edge of output clock CLK_OUT is driven by the input clock CLK_IN and thus has minimal device and supply noise added on, the rising edge has to be used for the analog signal sampling trigger. The falling edge of output clock CLK_OUT is driven by the control loop from the charge pump 18 to the delay cell 16 so that some additional clock jitter is added. The accumulated supply and device noise at the loop filter could increase the jitter at the falling edge of the clock more than 50 pS which is not acceptable for high input frequency sampling.

The shortcomings of the conventional duty stabilizer of FIG. 1 are as follows. First, the conventional duty cycle stabilizer 10 uses a PLL and a DLL to shift both the rising edges and the falling edges of the input clock signal to achieve the desired 50% duty cycle. The operation of the duty cycle stabilizer thus involves many logical transitions. As a result, a large amount of power supply and ground noise is generated where the supply/ground noise is continuous throughout the operation, as shown in FIG. 2.

When the duty cycle stabilizer 10 is applied in an ADC, multiple current glitches will appear during the analog sampling phase, such as when the output clock CLK_OUT is at the low phase. Current glitches will also appear during the hold phase when the output clock CLK_OUT is at the high phase. The current glitches introduce a significant amount of jitter on the rising edge of output clock CLK_OUT. The sampled analog signal during the hold phase after input sampling is a DC voltage which is immune to any kind of clock jitter. However, the power supply noise during the sampling phase of the output clock CLK_OUT deteriorates the sampling clock signal fidelity and results in a low SNR for a high frequency input signal.

The multiple logic transitions in duty cycle stabilizer 10 are mainly caused by the multiple delay cells in the programmable delay cell block 16. In some cases, the programmable delay cell can be implemented in the differential signaling mode to reduce the power supply noise. However, this results in larger die area and additional poser dissipation.

Second, the duty cycle of output clock CLK_OUT may be slightly different from that of the clock signal provided to charge pump 18 because of the presence of a clock buffer between the two nodes. For instance, if the duty cycle is off by 0.2 ns due to the unbalanced drive capability of PMOS and NMOS transistors and the shifted logic threshold level away from one-half of the power supply voltage, about 10% of settling time will be reduced on one phase of the clock when the clock frequency is 200 MHz after including 0.5 ns of non-overlap time between the internal clocks. The loss from the perspective of percentage will be even bigger at a higher clock frequency.

DETAILED DESCRIPTION OF THE PREFERRED EMBODIMENTS

In accordance with the principles of the present invention, a duty cycle stabilizer receiving an input clock and generating an output clock having a desired fixed duty cycle includes a leading edge pulse generator and a pulse width extender circuit. The duty cycle stabilizer uses the pulse generator to generate the leading edge of the output clock based on the leading edge of the input clock. The duty cycle stabilizer then uses the pulse width extender circuit to increase the pulse width of the output clock signal to obtain the desired duty cycle value. In one embodiment, the duty cycle stabilizer provides a fixed 50% duty cycle output clock signal.

The duty cycle stabilizer of the present invention minimizes the power supply noise or ground noise by minimizing noisy circuitry and properly managing logic transition timing. In this manner, the duty cycle stabilizer of the present invention generates an output clock signal having lower clock jitter and a precise duty cycle. A wide operating frequency range can also be realized using the duty cycle stabilizer of the present invention.

A salient feature of the duty cycle stabilizer of the present invention is that the duty cycle stabilizer is not constructed based on a PLL or DLL architecture, as is often done in conventional duty cycle stabilizer circuits. PLL and DLL based architecture uses delay cell chains and are inherently noisy in all phases of the clock signal. That is, the delay cell blocks in the PLL or DLL has the characteristics of generating distributed supply/ground noise all over the clock timing which has the effect of increasing clock jitter. By not using a PLL/DLL based architecture, the duty cycle stabilizer of the present invention can achieve lower clock jitter because of less supply/ground noise. Furthermore, the duty cycle stabilizer of the present invention does not use PLL or DLL circuit and therefore no start-up or force lock detect is required. The duty cycle stabilizer of the present invention will always lock to the correct duty cycle upon power up.

Figure 3:
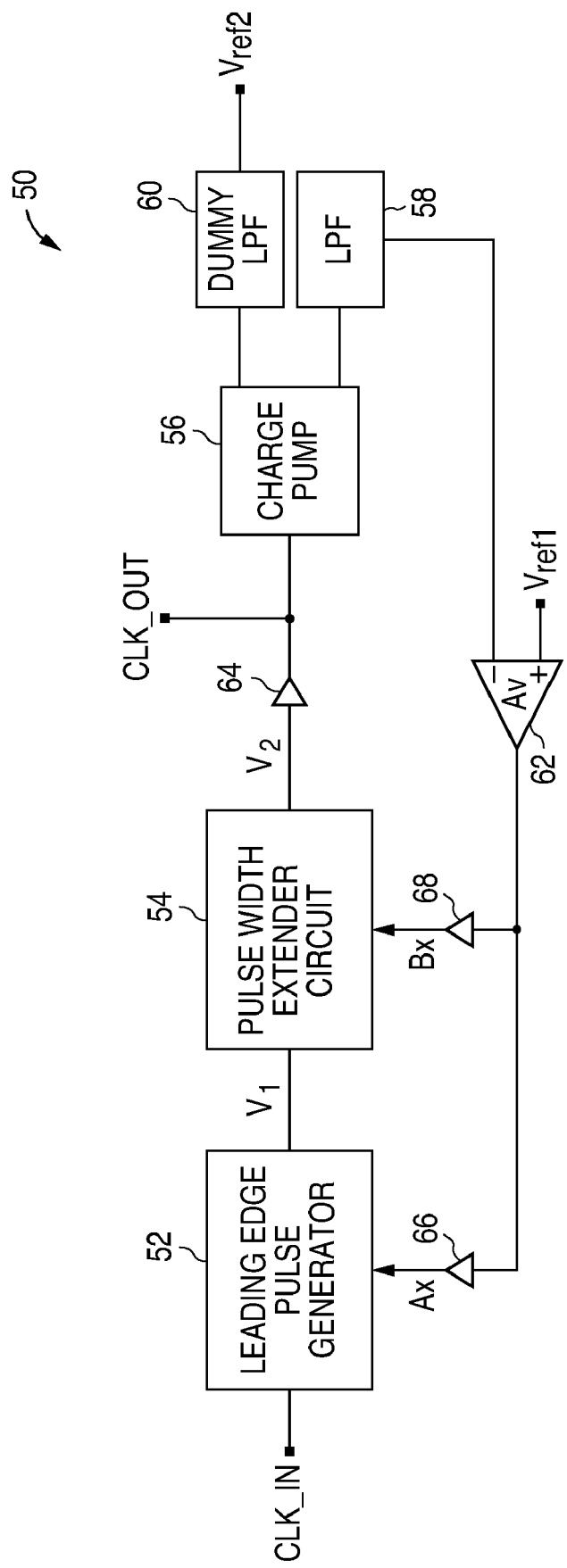
FIG. 3 is a schematic diagram of a duty cycle stabilizer according to a first embodiment of the present invention.

FIG. 3 is a schematic diagram of a duty cycle stabilizer according to a first embodiment of the present invention. Duty cycle stabilizer 50 can be configured to provide an output clock signal having any desired duty cycle. Parameters for establishing the desired duty cycle include the reference voltages Vref1 and Vref2 and the bias currents in the charge pump, as will be described in more detail below. Referring to FIG. 3, duty cycle stabilizer 50 includes a leading edge pulse generator 52, a pulse width extender circuit 54, a buffer 64, a charge pump (CP) 56, a low-pass filter (LPF) 58, a differential amplifier 62, and a dummy low-pass filter 60. Duty cycle stabilizer 50 operates by generating the leading edge of a clock pulse as triggered by the leading edge of the input clock and then stretching the trailing edge of the clock pulse to obtain the desired duty cycle, such as 50%. More specifically, the trailing edge of each clock pulse is not manipulated but is automatically extended to realize the desired duty cycle.

Differential amplifier 62, receiving the reference voltage Vref1, together with charge pump 56, establishes the duty cycle for the duty cycle stabilizer and is capable of establishing the desired duty cycle over a wide clock frequency range. Charge pump 56 is coupled to low-pass filter 58 for generating the comparison voltage for differential amplifier 62 and to dummy low-pass filter 60 biased to a reference voltage Vref2. Differential amplifier 62 provides an output signal which is amplified to bias current control signals Ax and Bx through respective buffers 66 and 68. Control signals Ax and Bx control the bias currents in leading edge pulse generator 52 and pulse width extender circuit 54 to adjust the delay through the blocks.

The operation of the duty cycle stabilizer 50 of the present invention is contrary to the conventional duty cycle stabilizer circuits where both the leading and trailing edges of the clock pulse are manipulated to adjust the duty cycle. By adjusting only the leading edge and automatically extending the trailing edge, duty cycle stabilizer 50 can operate with much reduced power supply/ground noise which is a major contributor to clock jitter.

Another feature of duty cycle stabilizer 50 of the present invention is the use of buffer 64 to buffer the output clock signal. In one embodiment, buffer 64 is configured to have sufficient drive capability to support the clock tree driven by output clock signal CLK_OUT. By including buffer 64 within the duty cycle loop, the amount of duty cycle deviation due to any buffering of the clock signal is minimized.

Figure 4:
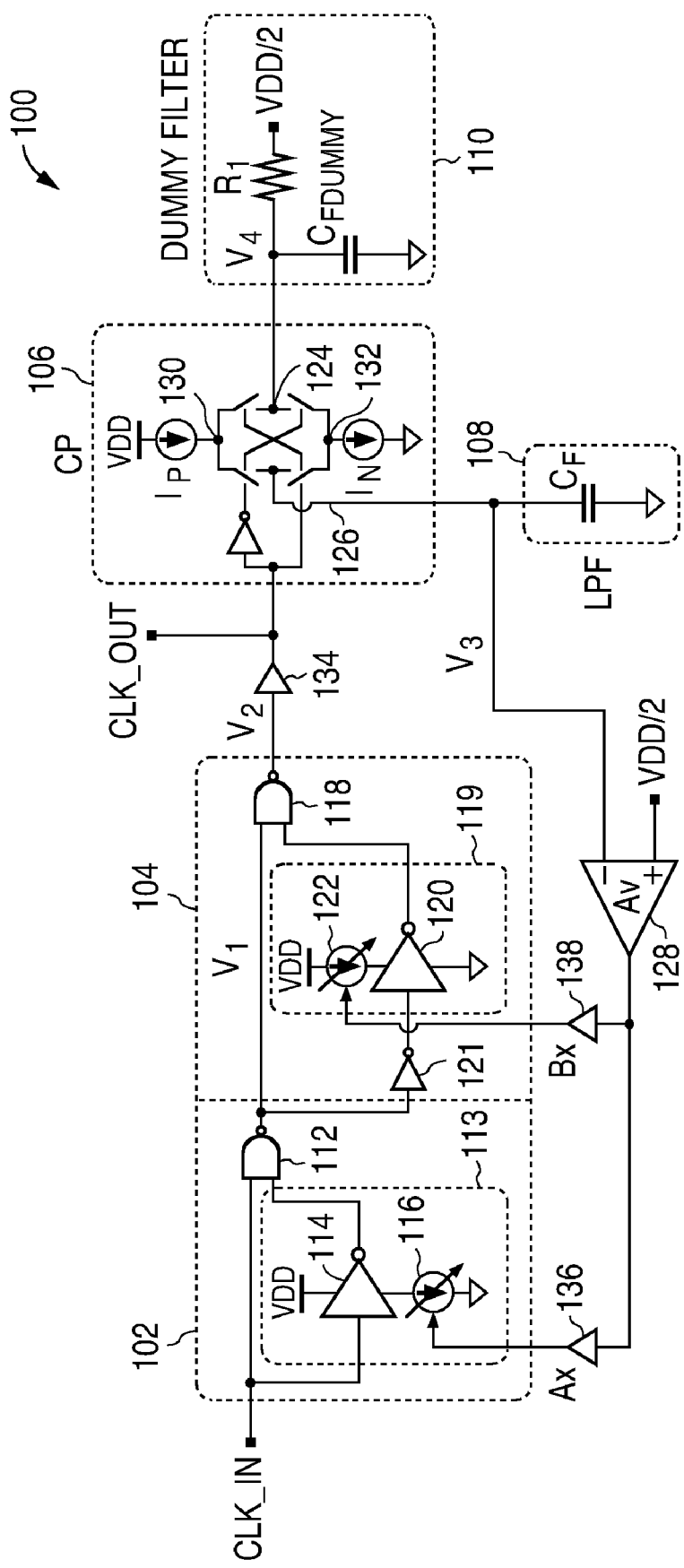
FIG. 4 is a circuit diagram of a duty cycle stabilizer according to a second embodiment of the present invention.

The detail construction of duty cycle stabilizer 50 will now be described with reference to FIG. 4 as well as FIG. 5 which illustrates the signal waveforms and the supply/ground currents of the duty cycle stabilizer of FIG. 4. FIG. 4 is a circuit diagram of a duty cycle stabilizer according to a second embodiment of the present invention. In the present embodiment, duty cycle stabilizer 100 is a fixed 50% duty cycle stabilizer. Thus, duty cycle stabilizer 100 receives an input clock signal (CLK_IN) and generates an output clock signal (CLK_OUT) having a 50% duty cycle. The use of 50% duty cycle is illustrative only. The duty cycle stabilizer of the present invention can be configured to provide other duty cycle values as desired, as will be described in more detail below.

Referring to FIG. 4, duty cycle stabilizer 100 includes a leading edge pulse generator 102, a pulse width extender 104, a buffer 134, a charge pump (CP) 106, a low-pass filter (LPF) 108, a differential amplifier 128, and a dummy filter 110. Differential amplifier 128 is used to establish the duty cycle for the duty cycle stabilizer and is capable of establishing the desired duty cycle over a wide clock frequency range. Duty cycle stabilizer 100 operates by generating the leading edge of a clock pulse and then stretching the trailing edge of the clock pulse to obtain the desired duty cycle, such as 50%. More specifically, the trailing edge of each clock pulse is not manipulated but is automatically extended to realize the 50% duty cycle.

Duty cycle stabilizer 100 includes leading edge pulse generator 102 ("pulse generator 102") receiving the input clock signal CLK_IN and providing a first clock pulse $V_1$ having a leading edge triggered off the leading edge of the input clock CLK_IN. Pulse generator 102 is a delay cell formed by an NAND gate 112 and a current controlled inverter 113. In the present embodiment, the "leading edge" refers to the rising edge of the input clock signal and therefore, current controlled inverter 113 is a pull-down type inverter. Controllable current limited inverter 113 includes an inverter 114 connected to the ground node through an adjustable current source 116. Adjustable current source 116 regulates the current flowing through inverter 114 based on a bias current control signal Ax.

In pulse generator 102, NAND gate 112 receives the input clock CLK_IN and the output signal of current controlled inverter 113 and generates first clock pulse $V_1$ having a leading edge triggered off the leading edge of the input clock CLK_IN and having a pulse duration $T_1$ indicative of the delay through current controlled inverter 113. Transitions of first clock pulse $V_1$ have signal polarities opposite to that of the input clock CLK_IN. That is, the rising edge of the input clock CLK_IN triggers the falling edge of first clock pulse $V_1$.

Duty cycle stabilizer 100 further includes a pulse width extender circuit 104 receiving the first clock pulse $V_1$ and generating a second clock pulse $V_2$ which is buffered by buffer 134 to become the output clock signal CLK_OUT. Pulse width extender circuit 104 is a delay cell formed by an NAND gate 118 and a current controlled inverter 119. Current controlled inverter 119 receives an inverse of first clock pulse $V_1$ and operates on the trailing edge of the first clock pulse $V_1$. Current controlled inverter 119 is therefore a pull-up type inverter. Current controlled inverter 119 includes an inverter 120 connected to the positive power supply VDD node through an adjustable current source 122. Adjustable current source 122 regulates the current flowing through inverter 120 based on a control signal Bx.

In pulse width extender circuit 104, NAND gate 118 receives the first clock pulse $V_1$ and the output signal of current controlled inverter 119 and generates second clock pulse $V_2$. Second clock pulse $V_2$ is inverse in polarity to clock pulse $V_1$ and has a leading edge corresponding to the leading edge of first clock pulse $V_1$. Current controlled inverter 119 operates to extend the pulse width of first clock pulse $V_1$ by the amount $T_2$ to the desired 50% duty cycle. Second clock pulse $V_2$ is basically a reshaped first clock pulse $V_1$ with the duty cycle extended to the desired 50% value. Second clock pulse $V_2$, having the same frequency as the input clock CLK_IN and the desired 50% duty cycle, is buffered by buffer 134 to generate the output clock signal CLK_OUT having a precise 50% duty cycle. In the present embodiment, buffer 134 is a buffer with sufficient drive capability for a clock tree coupled to receive the output clock signal CLK_OUT.

Figure 5:
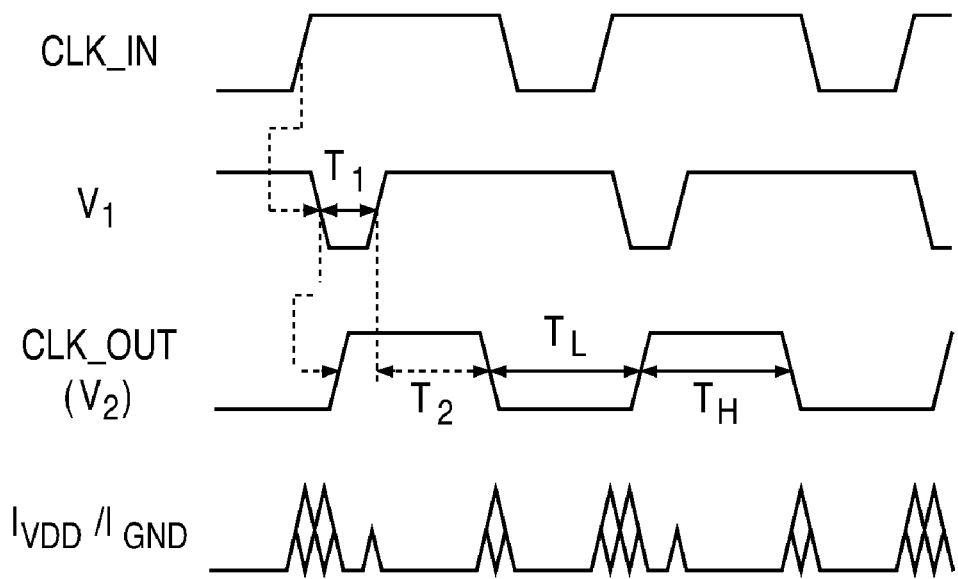
FIG. 5 illustrates the signal waveforms as well as the supply/ground currents of duty cycle stabilizer of FIG. 4.

The operation of pulse generator 102 and pulse width extender circuit 104 is illustrated by the waveforms in FIG. 5. The waveforms in FIG. 5 and in subsequence figures assume that the duty stabilizer circuit has reached steady state condition where all the signals settled into steady state operation. Each leading (rising) edge of the input clock CLK_IN triggers a leading (falling) edge of first clock pulse $V_1$. First clock pulse $V_1$ has a pulse duration of $T_1$. The leading (falling) edge of first clock pulse $V_1$ triggers the leading (rising) edge of second clock pulse $V_2$. The trailing (rising) edge of first clock pulse $V_1$ is extended by a duration of $T_2$ and then the trailing (falling) edge of second clock pulse $V_2$ is triggered. As a result, an output clock CLK_OUT having the same frequency as the input clock CLK_IN and having 50% duty cycle ($T_L=T_H$) is generated.

Figure 1:
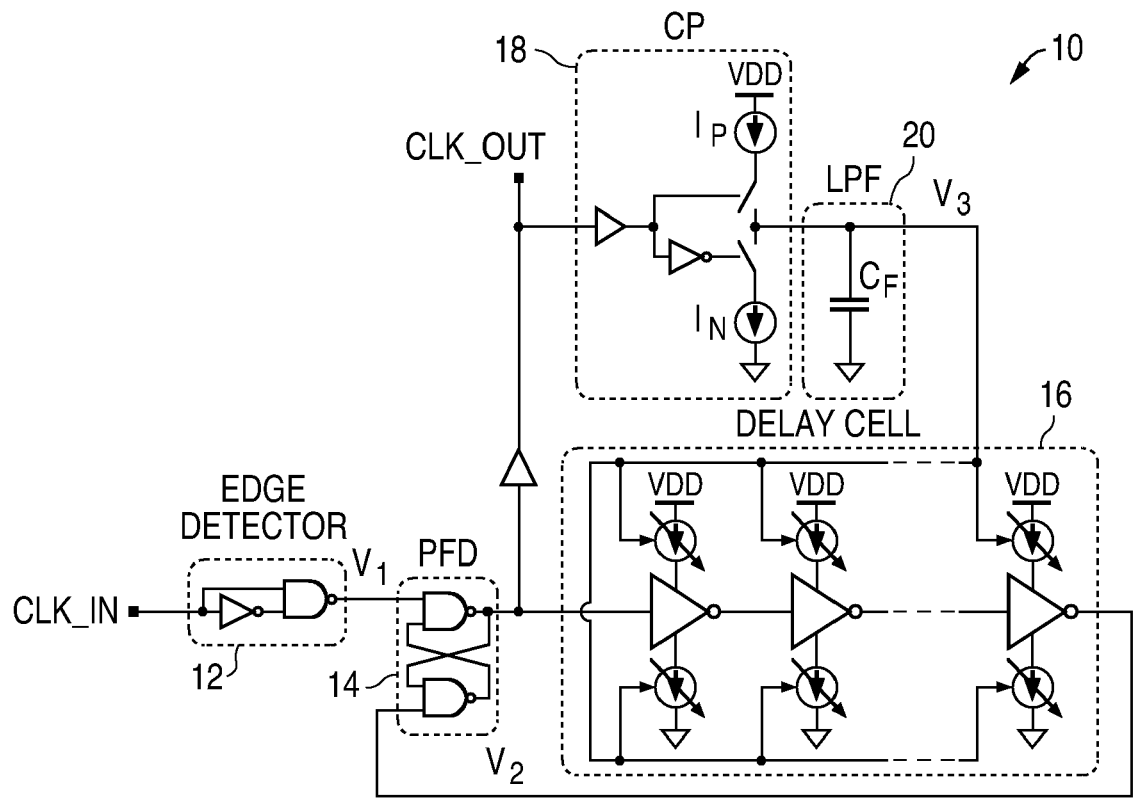
FIG. 1 illustrates a conventional duty cycle stabilizer.
Figure 2:
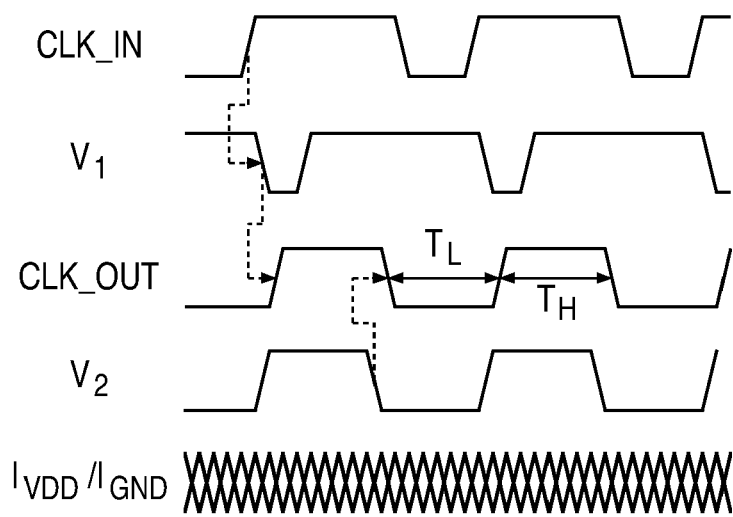
FIG. 2 includes signal waveforms of input clock, output clock and intermediate signals as well as the power supply and ground currents of the duty cycle stabilizer of FIG. 1.
Figure 6A:
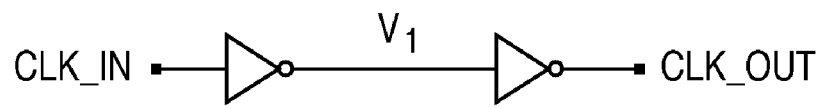
FIG. 6A illustrates an inverter chain which can be used to implement a clock chain.
Figure 6B:
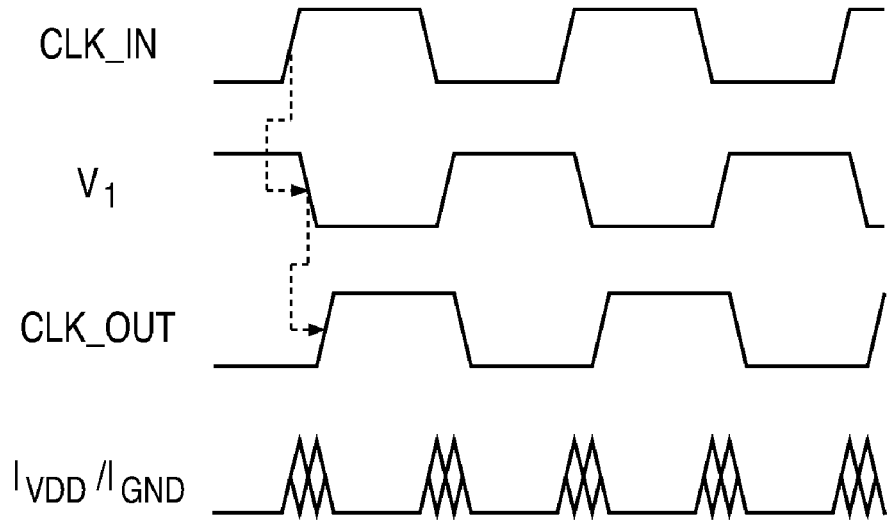
FIG. 6B illustrates the signal waveforms as well as the supply/ground currents of the clock chain of FIG. 6A.

The last waveform in FIG. 5 illustrates the power supply and ground currents generated during the operation of duty cycle stabilizer 100 of FIG. 4. A comparison of the supply/ground currents in FIG. 5 with the supply/ground currents in FIG. 2 shows that the duty cycle stabilizer of the present invention operates with much reduced supply/ground noise. Thus, power supply and ground glitches that can contribute to clock jitter are minimized as compared to conventional duty cycle stabilizers. Furthermore, the amount of supply/ground noise is comparable to clock chains that have no duty cycle stabilizer for low clock jitter. FIG. 6A illustrates an inverter chain which can be used to implement a clock chain. The inverter chain in FIG. 6A has no duty cycle stabilizer. The power supply/ground currents generated by the clock chain of FIG. 6A is shown in FIG. 6B together with the signal waveforms through the inverter chain. The supply/ground currents of the duty cycle stabilizer of the present invention (bottom waveform of FIG. 5) is comparable to the supply/ground currents of the clock chain without duty cycle stabilizer (bottom waveform of FIG. 6B). Therefore, the use of the duty cycle stabilizer of the present invention does not introduce any additional supply/ground noise that would not otherwise be present in the circuit.

The pulse width $T_1$ of first clock pulse $V_1$ is given as:

$$T_1 = T_H \cdot \frac{Bx}{Ax + Bx}, \qquad \text{Eq. (3)}$$

where $T_H$ and $T_L$ is same for 50% duty cycle, Ax and Bx are the amount of bias current gain factors over the output signal of differential amplifier 128. In one embodiment, the bias current control signal Ax and Bx are selected to arrange the logic transitions of the pulse generator to minimize supply noise, as will be described in more detail below.

Returning to FIG. 4, the output clock CLK_OUT drives the charge pump 106 directly, without any intervening buffer. One output terminal (node 124) of charge pump 106 drives a dummy low-pass filter 110. Dummy low-pass filter 110 includes a capacitor $C_{FDUMMY}$ connected between node 124 and ground and a resistor $R_1$ connected between node 124 and a voltage VDD/2. As a result, output terminal 124 of charge pump 106 is driven to a voltage $V_4$ having a voltage value of VDD/2. Capacitor $C_{FDUMMY}$ must be big enough to suppress down the charge mismatch from the switches in charge pump 106 connected to the currents IP and IN respectively. Dummy filter 110 is provided to ensure the biasing point of charge pump 106 stay up at the desired level during operation of the duty cycle stabilizer.

Charge pump 106 includes a second output terminal 126 driving low-pass filter 108 which is formed by a capacitor CF. A voltage $V_3$ develops at low-pass filter 108 which is coupled to drive the inverting input terminal of differential amplifier 128. The non-inverting input terminal of differential amplifier 128 is coupled to receive a voltage of VDD/2. Differential amplifier 128 provides an output signal which is buffered into bias current control signals Ax and Bx for driving the delay cell of pulse generator 102 and the delay cell of pulse width extender circuit 104.

More specifically, at differential amplifier 128, voltage $V_3$ from low-pass filter 108 is compared to voltage VDD/2. Differential amplifier 128 will cause its output voltage to converge to voltage VDD/2. The output signal from differential amplifier 128 is coupled to a buffer 136 and a buffer 138 to generate bias current control signals Ax and Bx, respectively, having the desired gain factor. Control signals Ax and Bx drive their respective delay cells to adjust the bias current flowing in the cells to keep the duty cycle of the output clock CLK_OUT at exactly 50%.

Control signals Ax and Bx based on the output signal of differential amplifier 128 and have different gain factors. In one embodiment, more current on the first delay cell (pulse generator 102) is preferred to arrange the logic transition at the beginning of each clock phase for lower supply noise. In that case, the ratio between Ax and Bx is set 2:1. However, in other embodiment, the ratio of Ax to Bx can be set to other values depending on the application.

For duty cycle stabilizer 100, the acceptable duty cycle range of the input clock signal is limited by $T_1/(T_L+T_H)$. The duty cycle range is about 17% with Ax=2Bx on the low side. On the other hand, the duty cycle range can go up to more 90% with an input clock frequency of 200 MHz for high side because the duty cycle is limited only by two logic gate delays, which is normally 0.3~0.4 ns in a 0.35 µm 3V CMOS fabrication process.

In charge pump 106, two common nodes 130 and 132 are connected to currents $I_P$ and $I_N$, respectively, and are connected to low-pass filter 108 and dummy LPF 110 through switches. Common nodes 130, 132 are kept at a constant voltage level for more accurate duty cycle by reducing the charge injection mismatches from the switches.

In duty cycle stabilizer 100, the 50% duty cycle is set by the charge pump 106 to stretch the pulse width out to 50% before tripping the trailing edge of second clock pulse $V_2$, and hence the trailing edge of the output clock CLK_OUT. The duty cycle of the output clock CLK_OUT is precisely controlled to be immune to charge injection mismatch from the switches in the charge pump because of dummy filter 110 and also because of differential amplifier 128 receiving a fixed voltage on the non-inverting input terminal. Moreover, the output clock CLK_OUT drives the charge pump 106 directly, without any intervening buffer, to eliminate duty cycle distortion.

In the present embodiment, the duty cycle is set at 50%. In other embodiments, the desired duty cycle of the duty cycle stabilizer can be selected by setting the current ratio between currents $I_P$ and $I_N$. Alternately, the desired duty cycle can be set by selecting the appropriate reference voltage Vref1 for the non-inverting input terminal of the differential amplifier where the DC bias voltage for the dummy filter is inversely proportional to the reference voltage Vref1 of the differential amplifier.

More specifically, in charge pump 106, when currents $I_N$ and $I_P$ are equal, CLK_OUT duty cycle will be 50%, which is ideal for most applications implemented with means of switched capacitor circuit. In one embodiment, the duty cycle of the output clock signal of the duty cycle stabilizer is modified by adjusting the ratio of $I_N$ and $I_P$. For instance, a duty cycle of 66% or ⅔ of clock period in the output clock signal can be obtained by using a current $I_P$ being 0.5×$I_N$.

Duty cycle stabilizer 100 does not require any start-up circuit since the signal path for programmable pulse width control includes current controlled pull-down inverter 113, inverter 121, and current controlled pull-up inverter 119—an odd number of inverters. During the initial condition where the current through current source 122 is zero, the output of inverter 121 is high and the output of inverter 120 is low so that the output of the differential amplifier 128 moves to ground in order to increase the bias current at current source 122. Once there is even a very small amount of bias current flowing through inverter 120, the whole negative feedback loop will be initiated and duty cycle stabilizer will then settle down to a stable condition.

The duty cycle stabilizer of the present invention provides many advantages over conventional duty cycle stabilizers. First, the duty cycle stabilizer of the present invention includes minimal logic circuits and thus logic toggling during the analog input sampling phase is minimized. The supply/ground noise is greatly minimized and noise is generated only when the leading edge is being held. The additional clock jitter contributed by the circuitry of the duty cycle stabilizer of the present invention is minimized to be same as the simple inverter type clock signal path (as shown in FIG. 6A). As a result, the duty cycle stabilizer of the present invention operates with reduced clock jitter.

Second, the duty cycle stabilizer of the present invention replaces the PFD and programmable delay cell blocks of the conventional circuits with a simple pulse width extender circuit. The duty cycle stabilizer circuit of the present invention is simpler to implement and takes up less silicon space as compare with the conventional stabilizers.

Third, the duty cycle stabilizer of the present invention uses the output clock CLK_OUT directly as the input clock of the charge pump so that duty cycle distortion is minimized.

Alternate Embodiments

Figure 7:
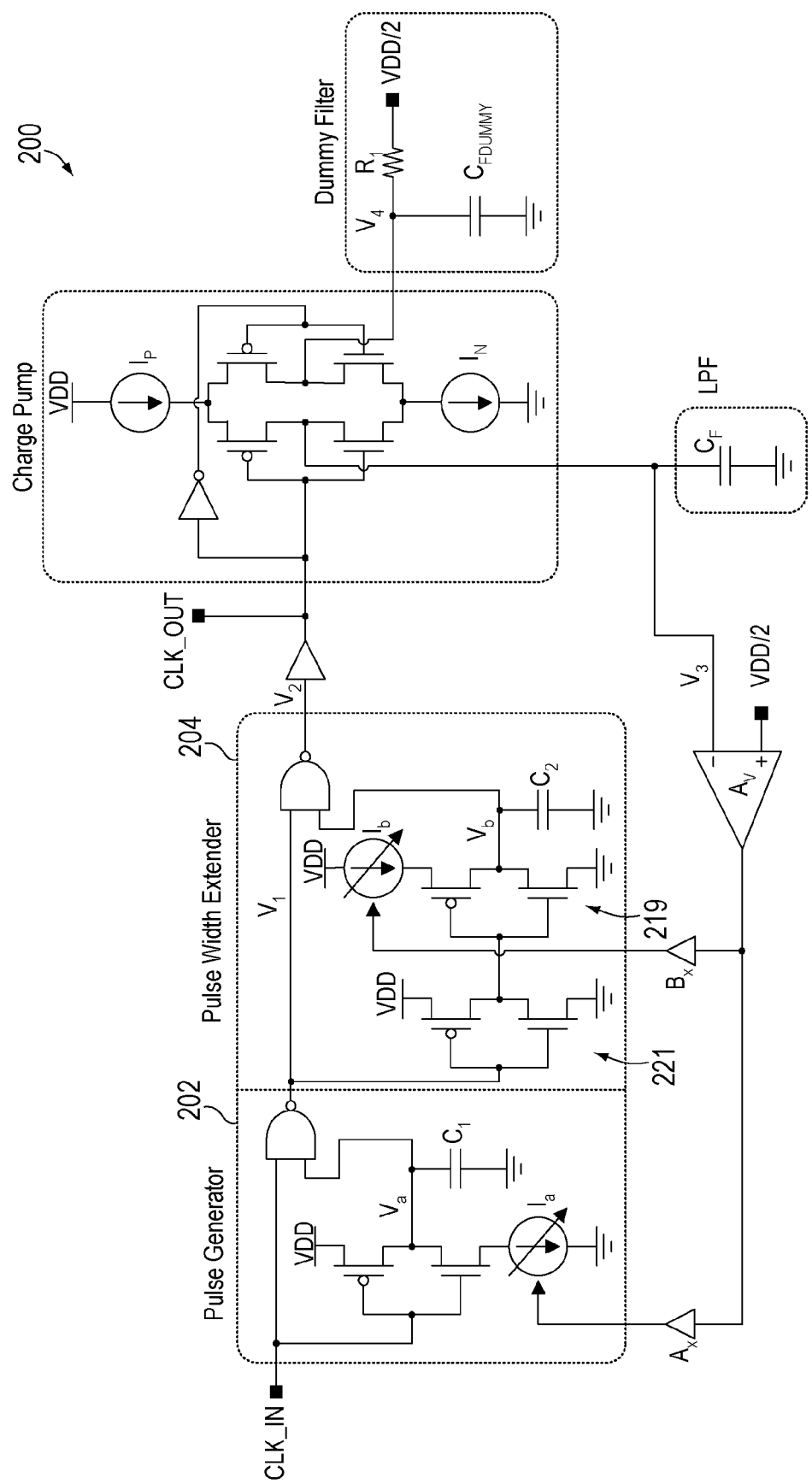
FIG. 7 is a transistor level circuit diagram illustrating one implementation of the duty cycle stabilizer of FIG. 4 according to a third embodiment of the present invention.

FIG. 7 is a transistor level circuit diagram illustrating one implementation of the duty cycle stabilizer 100 of FIG. 4 according to a third embodiment of the present invention. Duty cycle stabilizer 200 of FIG. 7 is configured in the same manner as duty cycle stabilizer 100 with CMOS inverter pairs used to form the inverters and the charge pump. In leading edge pulse generator 202 of duty cycle stabilizer 200, a capacitor $C_1$ is coupled to the output node of the inverter pair of transistors. The voltage controlled current source $I_a$ and capacitor C1 determines the pulse width provided by the leading edge pulse generator. In pulse width extender circuit 204, a capacitor $C_2$ is coupled to the output node of the inverter pair of transistors. The voltage controlled current source $I_b$ and capacitor C2 determines the pulse width provided by the pulse width extender. Duty cycle stabilizer 200 operates the same manner as described above to trigger off the rising edge of the input clock and generate an output clock CLK_OUT having a precisely controlled 50% duty cycle.

Figure 8:
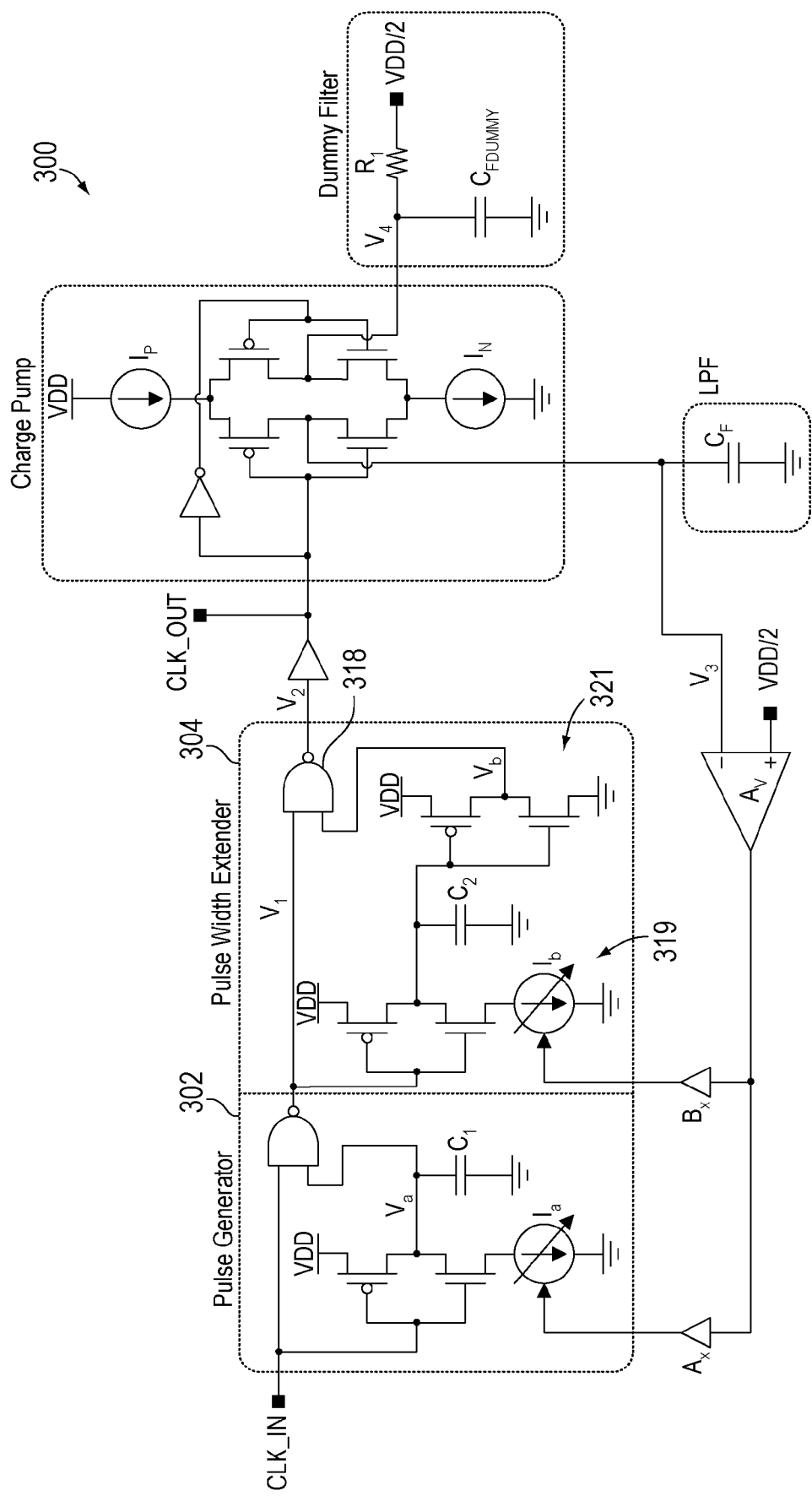
FIG. 8 is a transistor level circuit diagram of a duty cycle stabilizer according to a fourth embodiment of the present invention.

FIG. 8 is a transistor level circuit diagram of a duty cycle stabilizer according to a fifth embodiment of the present invention. Referring to FIG. 8, duty cycle stabilizer 300 is configured in the same manner as duty cycle stabilizer 200 of FIG. 7 except for pulse width extender circuit 304. In duty cycle stabilizer 200, an inverter 221 is placed at the input of current controlled pull-up inverter 219. Duty cycle stabilizer 300 illustrates an alternate implementation of the pulse width extender circuit 304 where the inverter 321 is placed at the output of current controlled pull-down inverter 319. Duty cycle stabilizer 300 operates in the same manner as described above to trigger off the rising edge of the input clock and generate an output clock CLK_OUT having a precisely controlled 50% duty cycle.

Figure 9:
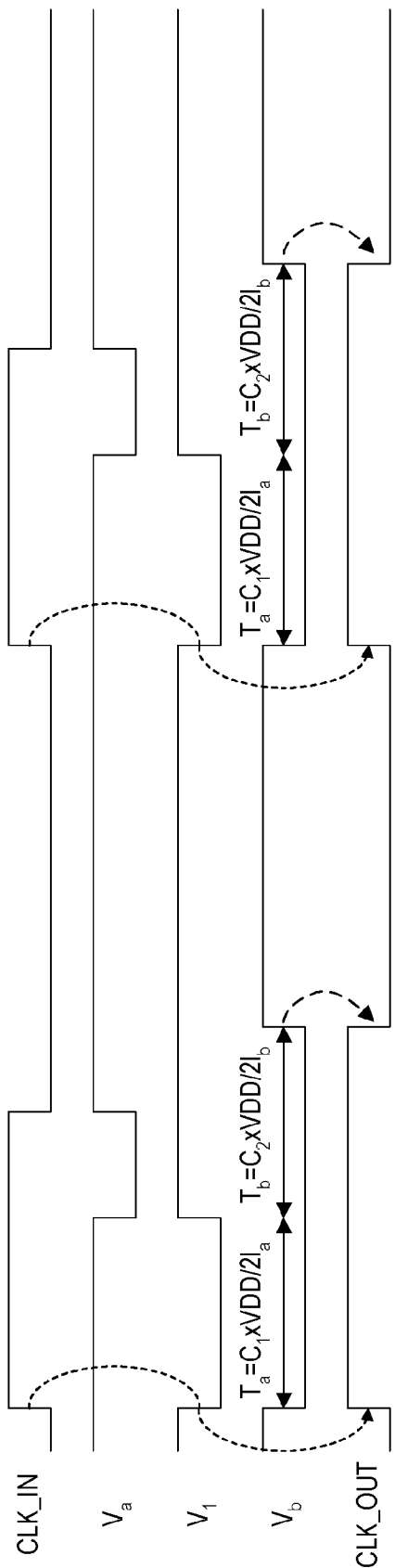
FIG. 9 illustrates signal waveforms for the duty cycle stabilizers of FIGS. 7 and 8.

FIG. 9 illustrates signal waveforms for the duty cycle stabilizers of FIGS. 7 and 8. As shown in FIG. 9, the rising edge of the input clock signal CLK_IN triggers the falling edge of first clock pulse $V_1$ which triggers the rising edge of the output clock CLK_OUT. First clock pulse $V_1$ has a duration of time $T_a$. Then, in pulse width extender circuit, the falling edge of clock pulse $V_b$ follows first clock pulse $V_1$ but the rising edge is stretched by a time $T_b$ to obtain the desired 50% duty cycle. Time $T_a$ and $T_b$ are current controlled delays which are function of the bias currents $I_a$ and $I_b$ provided to the delay cells of the pulse generator 202 and the pulse width extender circuit 204.

In the above described embodiments, the duty cycle stabilizers trigger off the rising edge of the input clock pulses. In other embodiments of the present invention, the duty cycle stabilizer can be configured to trigger off the falling edge of the input clock pulses. The duty cycle stabilizer can be configured to operate on either a rising edge or a falling edge as the leading edge of the input clock signal.

Figure 10:
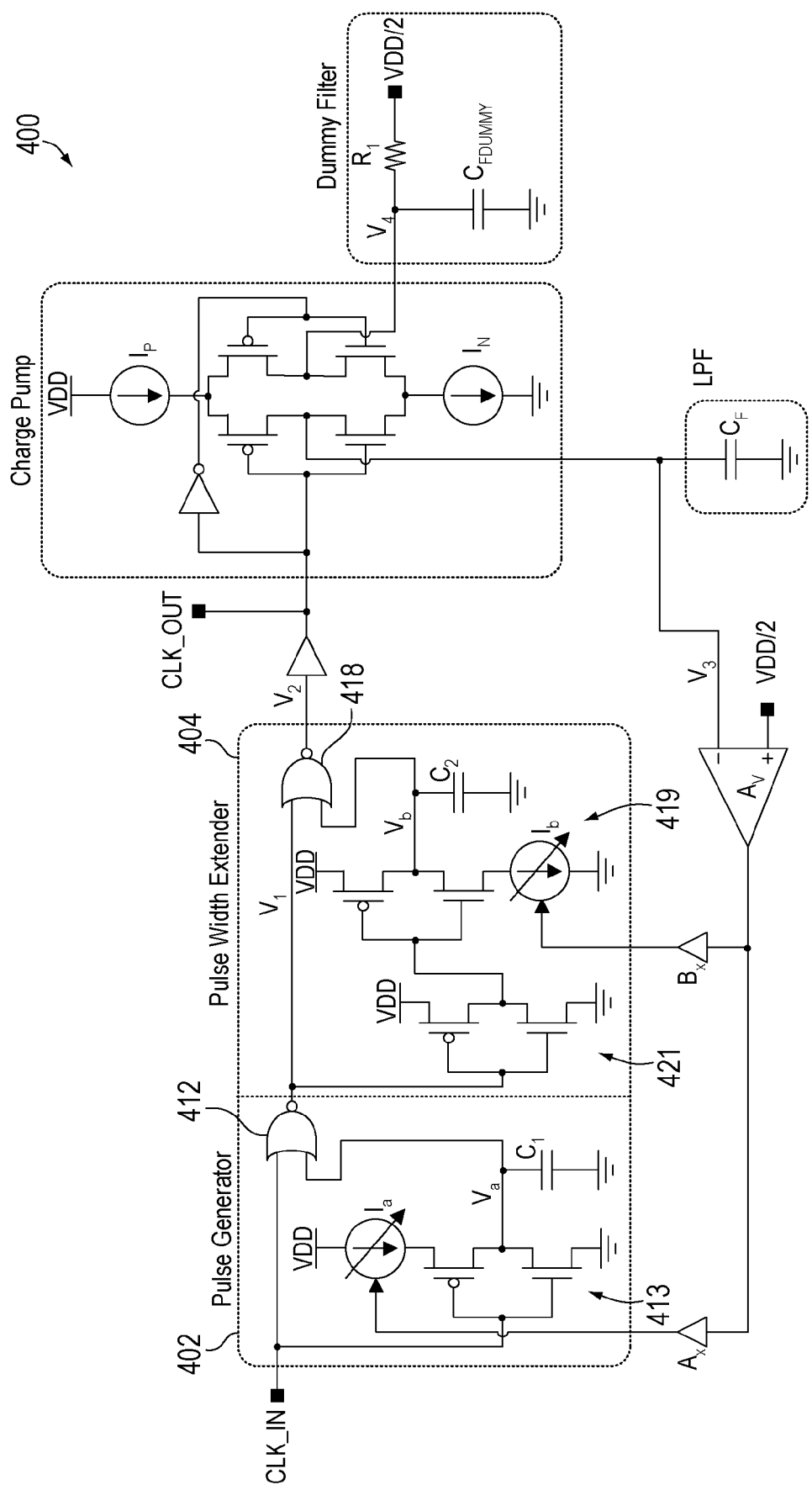
FIG. 10 is a transistor level circuit diagram of a duty cycle stabilizer according to a fifth embodiment of the present invention.

FIG. 10 is a transistor level circuit diagram of a duty cycle stabilizer according to a fifth embodiment of the present invention. Referring to FIG. 10, duty cycle stabilizer 400 configured to trigger off the falling edge of the input clock signal. That is, the leading edge of the input clock signal is the falling edge. In duty cycle stabilizer 400, the leading edge pulse generator 402 is implemented using a current controlled pull-up inverter 413 and an NOR gate 412. The pulse width extender circuit 404 includes an NOR gate 418, an inverter 421 coupled to the input of a current controlled pull-down inverter 419. Other than the leading edge being the falling edge of the input clock and the reversal of the signal polarities, duty cycle stabilizer 400 operates in the same manner as described above to trigger off the falling edge of the input clock and generate an output clock CLK_OUT having a precisely controlled 50% duty cycle.

Figure 11:
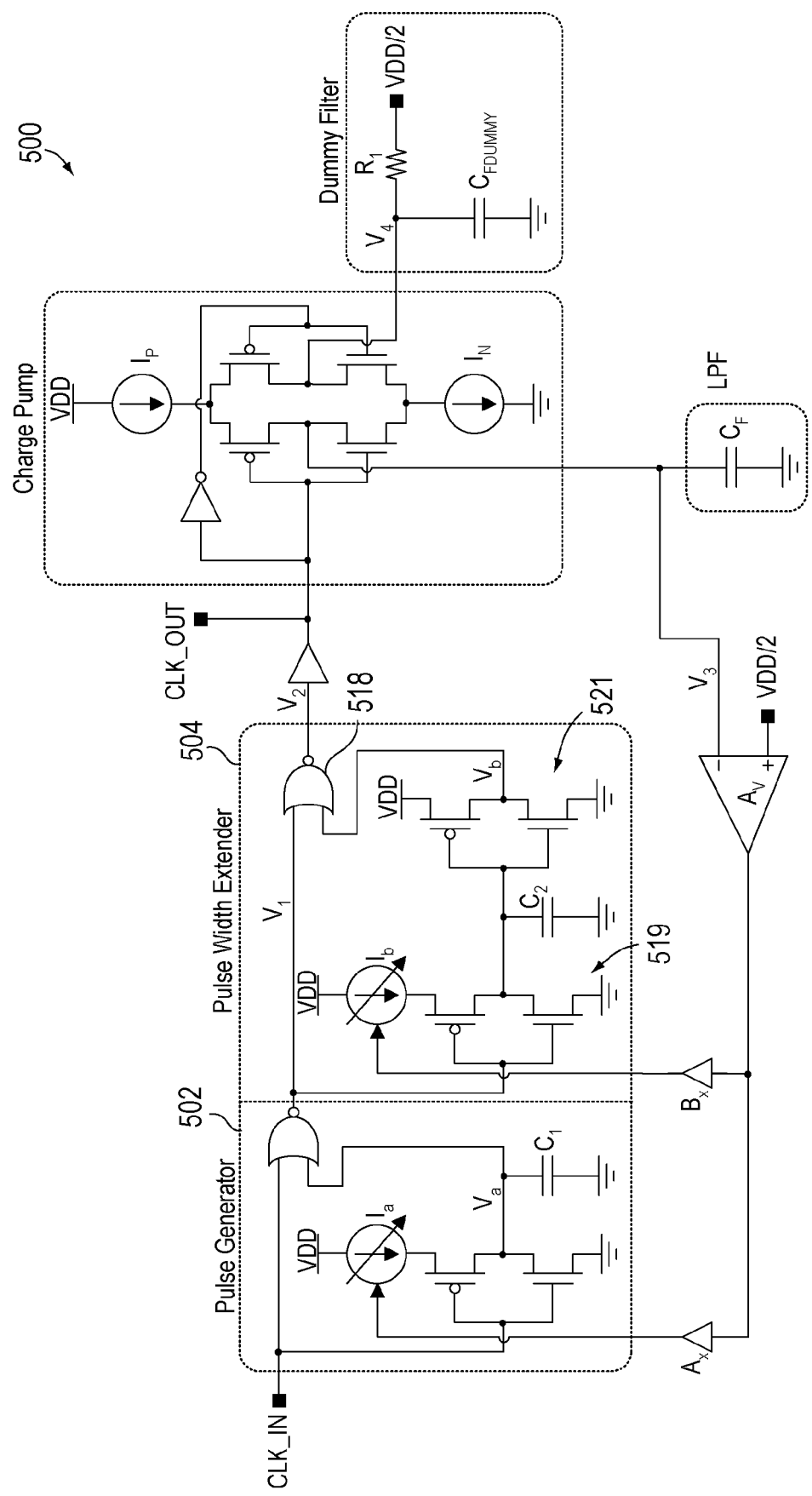
FIG. 11 is a transistor level circuit diagram of a duty cycle stabilizer according to a sixth embodiment of the present invention.

FIG. 11 is a transistor level circuit diagram of a duty cycle stabilizer according to a sixth embodiment of the present invention. Referring to FIG. 11, duty cycle stabilizer 500 is configured in the same manner as duty cycle stabilizer 400 of FIG. 10 except for pulse width extender circuit 504. In duty cycle stabilizer 400, inverter 421 is placed at the input of current controlled pull-down inverter 419. Duty cycle stabilizer 500 illustrates an alternate implementation of the pulse width extender circuit 504 where the inverter 521 is placed at the output of current controlled pull-up inverter 519. Duty cycle stabilizer 500 operates in the same manner as described above to trigger off the falling edge of the input clock and generate an output clock CLK_OUT having a precisely controlled 50% duty cycle.

Figure 12:
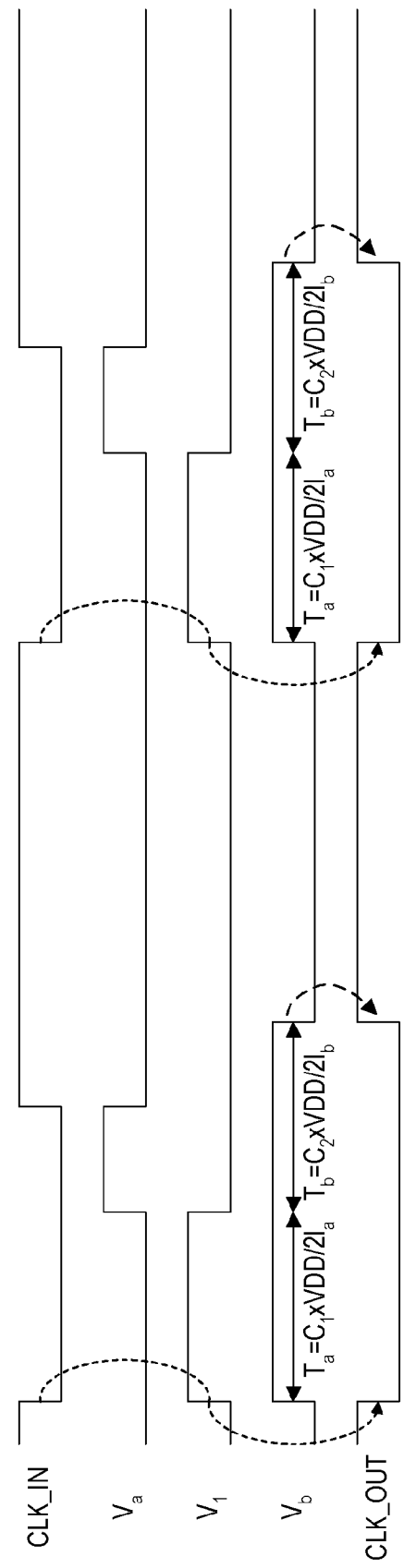
FIG. 12 illustrates signal waveforms for the duty cycle stabilizers of FIGS. 10 and 11.

FIG. 12 illustrates signal waveforms for the duty cycle stabilizers of FIGS. 10 and 11. As shown in FIG. 12, the falling edge of the input clock signal CLK_IN triggers the rising edge of first clock pulse $V_1$ which triggers the falling edge of the output clock CLK_OUT. First clock pulse $V_1$ has a duration of time $T_a$. Then, in pulse width extender circuit, the rising edge of clock pulse $V_b$ follows first clock pulse $V_1$ but the falling edge is stretched by a time $T_b$ to obtain the desired 50% duty cycle. Time $T_a$ and $T_b$ are current controlled delays which are function of the bias currents $I_a$ and $I_b$ provided to the delay cells of the pulse generator 202 and the pulse width extender circuit 204.

In the timing waveforms of FIGS. 9 and 12, it is assumed that every logic delay except the current controlled delay cells is zero for simplicity. If time $T_a$ is same as time $T_b$ and the duty cycle of input clock CLK_IN is shorter than time $T_a$, which is either 25% or 75% dependent on the topology, the duty cycle stabilizer would generate an extra toggling on the output clock CLK_OUT. The time $T_a$ could be shortened either by increasing current $I_a$ or decreasing capacitance $C_1$ to increase the range of input clock duty cycle that can be handled by the duty cycle stabilizer. Alternately, the pulse generator can be replaced by a fixed delay cell to generate a fixed amount of delay $T_a$ for first clock pulse $V_1$.

The relationship of the delay times $T_a$ and $T_b$ to the parameters of the duty cycle stabilizer is as follows. It is assumed that threshold of the logic gates (NAND or NOR) is VDD/2. Time $T_a$ can be derived based on the amount of charge change across a capacitor as a function of capacitance and voltage or current and time. Time $T_a$ can be given as follows:

$$Q = C \times V = I \times T;$$

$$I_a \times T_a = C_1 \times \frac{VDD}{2}; \quad T_a = C_1 \times \frac{VDD}{2I_a}. \quad \text{Eq. (4)}$$

Thus, the time $T_a$ can be modified by adjusting the value of either the capacitance $C_1$ or the current $I_a$ in the leading edge pulse generator.

Time $T_b$ can be similarly derived and given as follows:

$$Q = C \times V = I \times T;$$

$$I_b \times T_b = C_2 \times \frac{VDD}{2}; \quad T_b = C_2 \times \frac{VDD}{2I_b}. \quad \text{Eq. (5)}$$

As described above, the duty cycle stabilizer of the present invention can be configured in various way to either trigger off the rising edge or the falling edge of the input clock signal. Furthermore, the pulse width extender circuit can be implemented with either a pull-up or a pull-down current controlled inverter for each triggering mode by either inverting the first clock pulse before or after the current controlled inverter.

In the embodiments shown in FIGS. 7, 8, 10 and 11, the buffer driving the output clock signal CLK_OUT can be implemented using a buffer with sufficient drive capability to support the clock tree driven by the output clock signal CLK_OUT.

According to an alternate embodiment of the present invention, a high speed unity gain amplifier can be used to replace the dummy filter in duty cycle stabilizer. However, a unity gain amplifier may cause additional power dissipation and jitter on the trailing edge of the clock pulses due to the device noise.

The above detailed descriptions are provided to illustrate specific embodiments of the present invention and are not intended to be limiting. Numerous modifications and variations within the scope of the present invention are possible. For instance, other logic gates can be used to implement the logical NAND and logical NOR functions in the duty cycle stabilizer of the present invention. The present invention is defined by the appended claims.

We claim:

1. A duty cycle stabilizer circuit (50) receiving an input clock signal and generating an output clock signal having a first duty cycle, the duty cycle stabilizer circuit comprising:
   a leading edge pulse generator (52) receiving the input clock signal and generating a first clock pulse ($V_1$) having a leading edge triggered by the leading edge of the input clock signal, transitions of the first clock pulse having signal polarities opposite to transitions of the input clock signal, the first clock pulse having a first pulse width being a function of a first control signal (Ax);
   a pulse width extender circuit (54) receiving the first clock pulse and generating a second clock pulse ($V_2$) having a leading edge triggered by the leading edge of the first clock pulse, transitions of the second clock pulse having signal polarities opposite to transitions of the first clock pulse, the second clock pulse having a pulse width being the sum of the first pulse width and a second pulse width, the second pulse width being a function of a second control signal (Bx);
   a buffer (64) receiving the second clock pulse and generating the output clock signal having the first duty cycle;
   a charge pump (56) receiving the output clock signal, the charge pump being coupled to drive a first low-pass filter (58) and a second low-pass filter (60); and
   a differential amplifier (62) receiving a first voltage at the first low-pass filter and a first reference voltage, the differential amplifier generating an output signal indicative of the difference between the first voltage and the first reference voltage, the first and second control signals being indicative of the output signal.

2. The duty cycle stabilizer circuit of claim 1, wherein the leading edge pulse generator comprises:
   a first current controlled inverter receiving the input clock as an input signal and providing an output signal, the first current controlled inverter having a bias current controlled by the first control signal; and
   a first logic gate receiving the input clock signal and the output signal of the first current controlled inverter and generating the first clock pulse.

3. The duty cycle stabilizer circuit of claim 2, wherein the leading edge pulse generator generates the first clock pulse having a falling edge triggered by the rising edge of the input clock signal, and wherein the first current controlled inverter comprises a current controlled pull-down inverter (113) and the first logic gate comprises a logic gate (112) providing a logical NAND function.

4. The duty cycle stabilizer circuit of claim 2, wherein the leading edge pulse generator generates the first clock pulse having a rising edge triggered by the falling edge of the input clock signal, and wherein the first current controlled inverter comprises a current controlled pull-up inverter (413) and the first logic gate comprises a logic gate (412) providing a logical NOR function.

5. The duty cycle stabilizer circuit of claim 2, further comprises a first capacitor ($C_1$) coupled between an output terminal of the first current controlled inverter and a ground voltage.

6. The duty cycle stabilizer circuit of claim 1, wherein the pulse width extender circuit comprises:
   a first inverter receiving the first clock pulse and generating an output signal being an inverse of the first clock pulse;
   a second current controlled inverter receiving the output signal of the first inverter as an input signal and providing an output signal, the second current controlled inverter having a bias current controlled by the second control signal; and
   a second logic gate receiving the first clock pulse and the output signal of the second current controlled inverter and generating the second clock pulse.

7. The duty cycle stabilizer circuit of claim 6, wherein the leading edge pulse generator generates the first clock pulse having a falling edge triggered by the rising edge of the input clock signal, and wherein the second current controlled inverter comprises a current controlled pull-up inverter (119) and the first logic gate comprises a logic gate (118) providing a logical NAND function.

8. The duty cycle stabilizer circuit of claim 6, wherein the leading edge pulse generator generates the first clock pulse having a rising edge triggered by the falling edge of the input clock signal, and wherein the second current controlled inverter comprises a current controlled pull-down inverter (419) and the first logic gate comprises a logic gate (418) providing a logical NOR function.

9. The duty cycle stabilizer circuit of claim 6, further comprises a second capacitor ($C_2$) coupled between an output terminal of the second current controlled inverter and a ground voltage.

10. The duty cycle stabilizer circuit of claim 1, wherein the pulse width extender circuit comprises:
    a second current controlled inverter receiving the first clock pulse as an input signal and providing an output signal, the second current controlled inverter having a bias current controlled by the second control signal;
    a first inverter receiving the output signal of the second current controlled inverter and generating an output signal; and
    a second logic gate receiving the first clock pulse and the output signal of the first inverter and generating the second clock pulse.

11. The duty cycle stabilizer circuit of claim 10, wherein the leading edge pulse generator generates the first clock pulse having a falling edge triggered by the rising edge of the input clock signal, and wherein the second current controlled inverter comprises a current controlled pull-down inverter (319) and the first logic gate comprises a logic gate (318) providing a logical NAND function.

12. The duty cycle stabilizer circuit of claim 10, wherein the leading edge pulse generator generates the first clock pulse having a rising edge triggered by the falling edge of the input clock signal, and wherein the second current controlled inverter comprises a current controlled pull-up inverter (519) and the first logic gate comprises a logic gate (518) providing a logical NOR function.

13. The duty cycle stabilizer circuit of claim 10, further comprises a second capacitor ($C_2$) coupled between an output terminal of the second current controlled inverter and a ground voltage.

14. The duty cycle stabilizer circuit of claim 1, wherein the charge pump comprises a first current source providing a first charge pump bias current ($I_P$) and a second current source providing a second charge pump bias current ($I_N$), the first charge pump bias current being switchably connected to a first output node and a second output node through a pair of switches being controlled by the output clock signal and its inverse, the second charge pump bias current being switchably connected to a second output node through a pair of switches being controlled by the output clock signal and its inverse.

15. The duty cycle stabilizer circuit of claim 14, wherein the first duty cycle is indicative of a ratio of the first charge pump current and the second charge pump current.

16. The duty cycle stabilizer circuit of claim 14, wherein the first low-pass filter comprises a capacitor (CF) having a first terminal coupled to the first output node of the charge pump and a second terminal coupled to a ground voltage, the first voltage being provided at the first terminal of the capacitor.

17. The duty cycle stabilizer circuit of claim 14, wherein the second low-pass filter comprises a capacitor ($C_{FDUMMY}$) having a first terminal coupled to the second output node of the charge pump and a second terminal coupled to a ground voltage, and a resistor coupled between the second output node of the charge pump and a second reference voltage.

18. The duty cycle stabilizer circuit of claim 17, wherein the first duty cycle is indicative of the first reference voltage and the second reference voltage, the second reference voltage being inversely proportional to the first reference voltage.

19. The duty cycle stabilizer circuit of claim 17, wherein each of the first reference voltage and the second reference voltage comprises one-half of a positive power supply voltage and the first duty cycle is 50%.

20. The duty cycle stabilizer circuit of claim 1, wherein the leading edge pulse generator comprises a fixed delay cell providing a fixed pulse width for the first clock pulse.

21. The duty cycle stabilizer circuit of claim 1, wherein the second low-pass filter comprises a unity gain amplifier.

22. The duty cycle stabilizer circuit of claim 1, wherein the buffer (64) comprises a buffer having a drive capability sufficient for driving a clock tree to be driven by the output clock signal.

23. A method of generating an output clock signal having a first duty cycle from an input clock signal, comprising:
receiving a leading edge of the input clock signal;
generating a first clock pulse ($V_1$) having a leading edge triggered by the leading edge of the input clock signal, leading edge of the first clock pulse being opposite in polarity to the leading edge of the input clock signal, and having a first pulse width, the first clock pulse having a first pulse width being a function of a first control signal (Ax);
generating a second clock pulse ($V_2$) having a leading edge triggered by the leading edge of the first clock pulse, transitions of the second clock pulse having signal polarities opposite to transitions of the first clock pulse, the second clock pulse having a pulse width being the sum of the first pulse width and a second pulse width, the second pulse width being a function of a second control signal (Bx);
generating a first voltage indicative of the duty cycle of the output signal;
generating the first control signal and the second control signal in response to the first voltage to modify the first pulse width and the second pulse width; and
buffering the second clock pulse to generate the output signal having the first duty cycle.

24. The method of claim 23, wherein generating a first clock pulse ($V_1$) having a leading edge triggered by the leading edge of the input clock signal comprises generating the first clock pulse ($V_1$) having a falling edge triggered by the rising edge of the input clock signal.

25. The method of claim 23, wherein generating a first clock pulse ($V_1$) having a leading edge triggered by the leading edge of the input clock signal comprises generating the first clock pulse ($V_1$) having a rising edge triggered by the falling edge of the input clock signal.

26. The method of claim 23, wherein buffering the second clock pulse to generate the output signal having the first duty cycle comprises:
buffering the second clock pulse using a buffer having a drive capability sufficient for driving a clock tree to be driven by the output signal to generate the output signal having the first duty cycle.

* * * * *